US010818660B2

(12) United States Patent
Liou et al.

(10) Patent No.: US 10,818,660 B2
(45) Date of Patent: Oct. 27, 2020

(54) SEMICONDUCTOR DEVICE

(71) Applicant: UNITED MICROELECTRONICS CORP., Hsin-Chu (TW)

(72) Inventors: En-Chiuan Liou, Tainan (TW); Yu-Cheng Tung, Kaohsiung (TW); Chih-Wei Yang, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 16/407,188

(22) Filed: May 9, 2019

(65) Prior Publication Data

US 2019/0267373 A1    Aug. 29, 2019

Related U.S. Application Data

(62) Division of application No. 15/242,591, filed on Aug. 21, 2016, now Pat. No. 10,332,877.

(51) Int. Cl.
*H01L 27/088* (2006.01)
*H01L 21/762* (2006.01)
*H01L 29/66* (2006.01)
*H01L 21/8234* (2006.01)
*H01L 29/78* (2006.01)

(52) U.S. Cl.
CPC .... *H01L 27/0886* (2013.01); *H01L 21/76224* (2013.01); *H01L 21/823431* (2013.01); *H01L 21/823481* (2013.01); *H01L 29/66545* (2013.01); *H01L 29/66795* (2013.01); *H01L 29/7851* (2013.01)

(58) Field of Classification Search
CPC ....... H01L 21/76224; H01L 21/823481; H01L 21/823431; H01L 29/66795; H01L 27/0886
See application file for complete search history.

(56) References Cited

U.S. PATENT DOCUMENTS

| 8,609,510 B1* | 12/2013 | Banna ............... H01L 29/66545 257/E21.409 |
| 2014/0027853 A1 | 1/2014 | Asenov |
| 2014/0191358 A1 | 7/2014 | Liou |
| 2014/0227848 A1* | 8/2014 | Kang .............. H01L 21/823431 438/283 |

* cited by examiner

*Primary Examiner* — Amar Movva
(74) *Attorney, Agent, or Firm* — Winston Hsu

(57) ABSTRACT

A manufacturing method of a semiconductor device includes the following steps. A semiconductor substrate including at least one fin structure is provided. A gate material layer is formed on the semiconductor substrate, and the fin structure is covered by the gate material layer. A trench is formed partly in the gate material layer and partly in the fin structure. An isolation structure is formed partly in the trench and partly outside the trench. At least one gate structure is formed straddling the fin structure by patterning the gate material layer after the step of forming the isolation structure. A top surface of the isolation structure is higher than a top surface of the gate structure in a vertical direction for enhancing the isolation performance of the isolation structure. A sidewall spacer is formed on sidewalls of the isolation structure, and there is no gate structure formed on the isolation structure.

6 Claims, 15 Drawing Sheets

SEMICONDUCTOR DEVICE

CROSS REFERENCE TO RELATED APPLICATIONS

This application is a division of application Ser. No. 15/242,591 filed on Aug. 21, 2016, now allowed, which is incorporated by reference herein in its entirety.

BACKGROUND OF THE INVENTION

1. Field of the Invention

The present invention relates to a semiconductor device and a manufacturing method thereof, and more particularly, to a semiconductor device having an isolation structure higher than a gate structure and a manufacturing method thereof.

2. Description of the Prior Art

The development of semiconductor integrated circuit technology progresses continuously and circuit designs in products of the new generation become smaller and more complicated than those of the former generation. The amount and the density of the functional devices in each chip region are increased constantly according to the requirements of innovated products, and the size of each device has to become smaller accordingly. For operating the integrated circuit devices of different functions independently or cooperatively, a great electrical isolation design is required to electrically isolating some of the integrated circuit devices from one another for preventing unwanted electrical coupling and/or unwanted electrical influence between adjacent components and devices. Therefore, for the related fields and industries, it is very important to improve the design of the electrical isolation structure integrated in the advanced process under the request for enhancing the integrity continuously.

SUMMARY OF THE INVENTION

It is one of the objectives of the present invention to provide a semiconductor device and a manufacturing method thereof. An isolation structure is partly formed in a fin structure and partly formed in an interlayer dielectric above the fin structure for provide an isolation effect between different regions in the fin structure. The isolation structure is higher than a gate structure formed on the fin structure, and a sidewall spacer is formed on sidewalls of the isolation structure. Therefore, there is no need to form a gate structure on the isolation structure, and negative influence of the gate structure formed on the isolation structure or sinking into the isolation structure on the isolation performance of the isolation structure may be avoided accordingly.

According to an embodiment of the present invention, a manufacturing method of a semiconductor device is provided. The manufacturing method includes the following steps. A semiconductor substrate is provided, and the semiconductor substrate includes at least one fin structure. A gate material layer is formed on the semiconductor substrate, and the fin structure is covered by the gate material layer. A trench is formed partly in the gate material layer and partly in the fin structure. An isolation structure is formed partly in the trench and partly outside the trench. At least one gate structure is formed straddling the fin structure by patterning the gate material layer after the step of forming the isolation structure.

According to an embodiment of the present invention, a semiconductor device is provided. The semiconductor device includes a semiconductor substrate, a plurality of gate structures, an interlayer dielectric, and an isolation structure. The semiconductor substrate includes at least one fin structure. The gate structures are disposed straddling the fin structure. The interlayer dielectric is disposed on the fin structure. The isolation structure is partly disposed in the fin structure and partly disposed in the interlayer dielectric above the fin structure. A top surface of the isolation structure is higher than a top surface of each of the gate structures in a vertical direction.

In the semiconductor device and the manufacturing method thereof according to the present invention, the trench is formed partly in the gate material layer and partly in the fin structure, and the isolation structure is formed partly in the trench and partly outside the trench for being higher than the gate material layer and the gate structure formed by patterning the gate material layer. The sidewall spacer formed on the sidewall of the gate structure will also be formed on the sidewall of the isolation structure, and there is no need to formed a gate structure on the isolation structure accordingly.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-11 are schematic drawings illustrating a manufacturing method of a semiconductor device according to a first embodiment of the present invention, wherein FIG. 2 is a cross-sectional diagram taken along a line A-A' in FIG. 1, FIG. 3 and FIG. 4 are schematic drawings in a step subsequent to FIG. 2, FIG. 4 is a cross-sectional diagram taken along a line B-B' in FIG. 3, FIG. 5 is a schematic drawing in a step subsequent to FIG. 4, FIG. 6 is a schematic drawing in a step subsequent to FIG. 5, FIG. 7 is a schematic drawing in a step subsequent to FIG. 6, FIG. 8 and FIG. 9 are schematic drawings in a step subsequent to FIG. 7, FIG. 8 is a cross-sectional diagram taken along a line C-C' in FIG. 9, FIG. 10 and FIG. 11 are schematic drawings in a step subsequent to FIG. 8, and FIG. 10 is a cross-sectional diagram taken along a line D-D' in FIG. 11.

DETAILED DESCRIPTION

Figure 1:
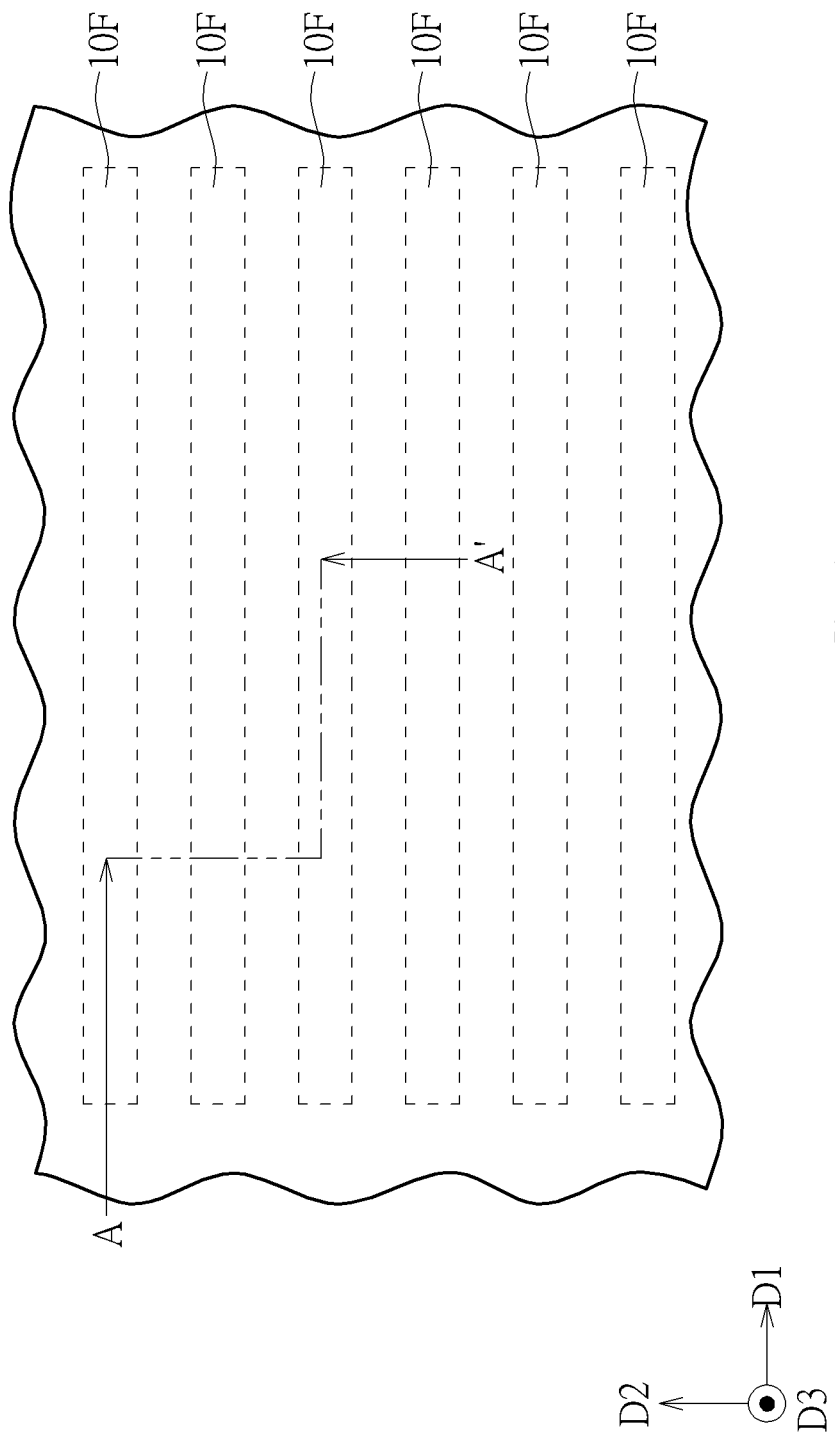
Figure 2:
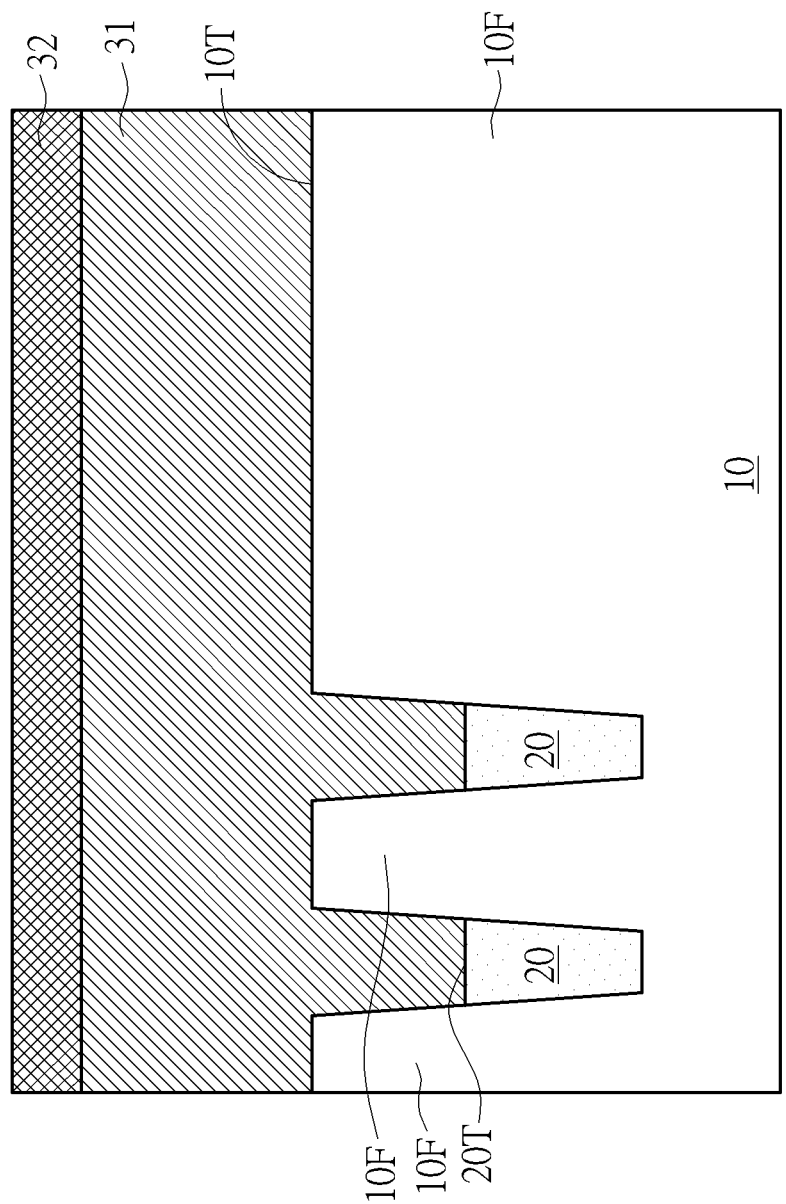
Figure 3:
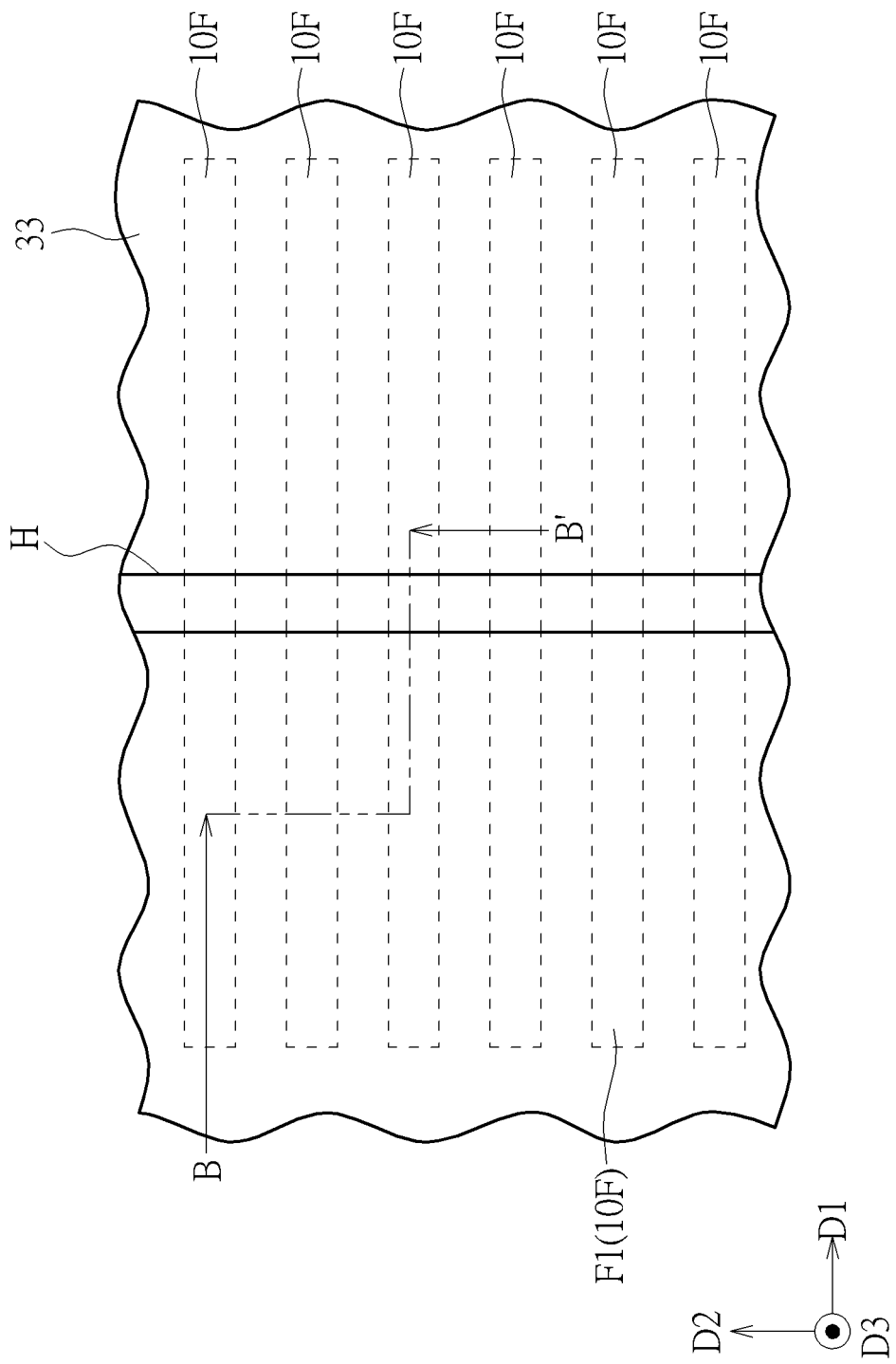
Figure 4:
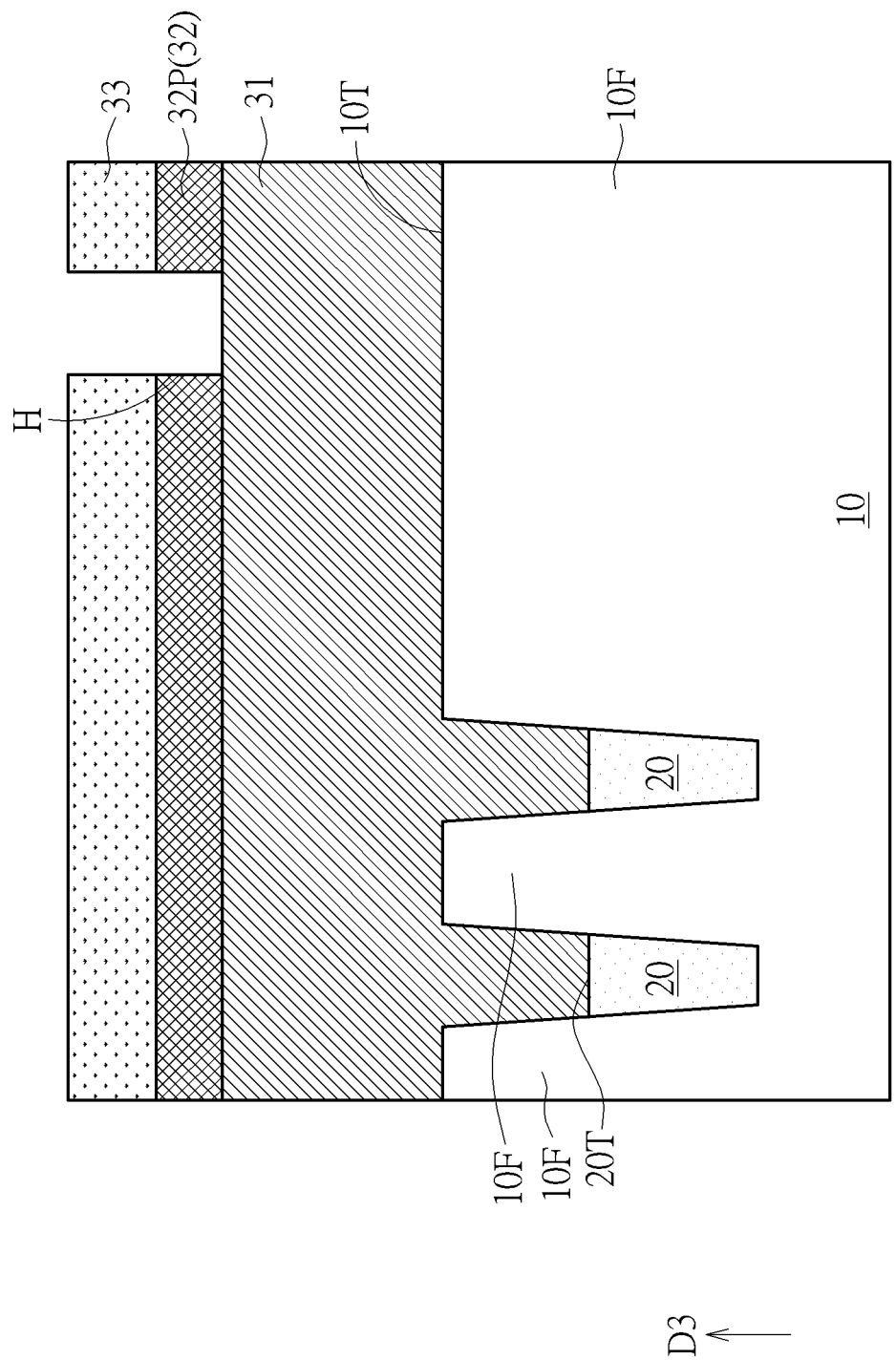
Figure 6:
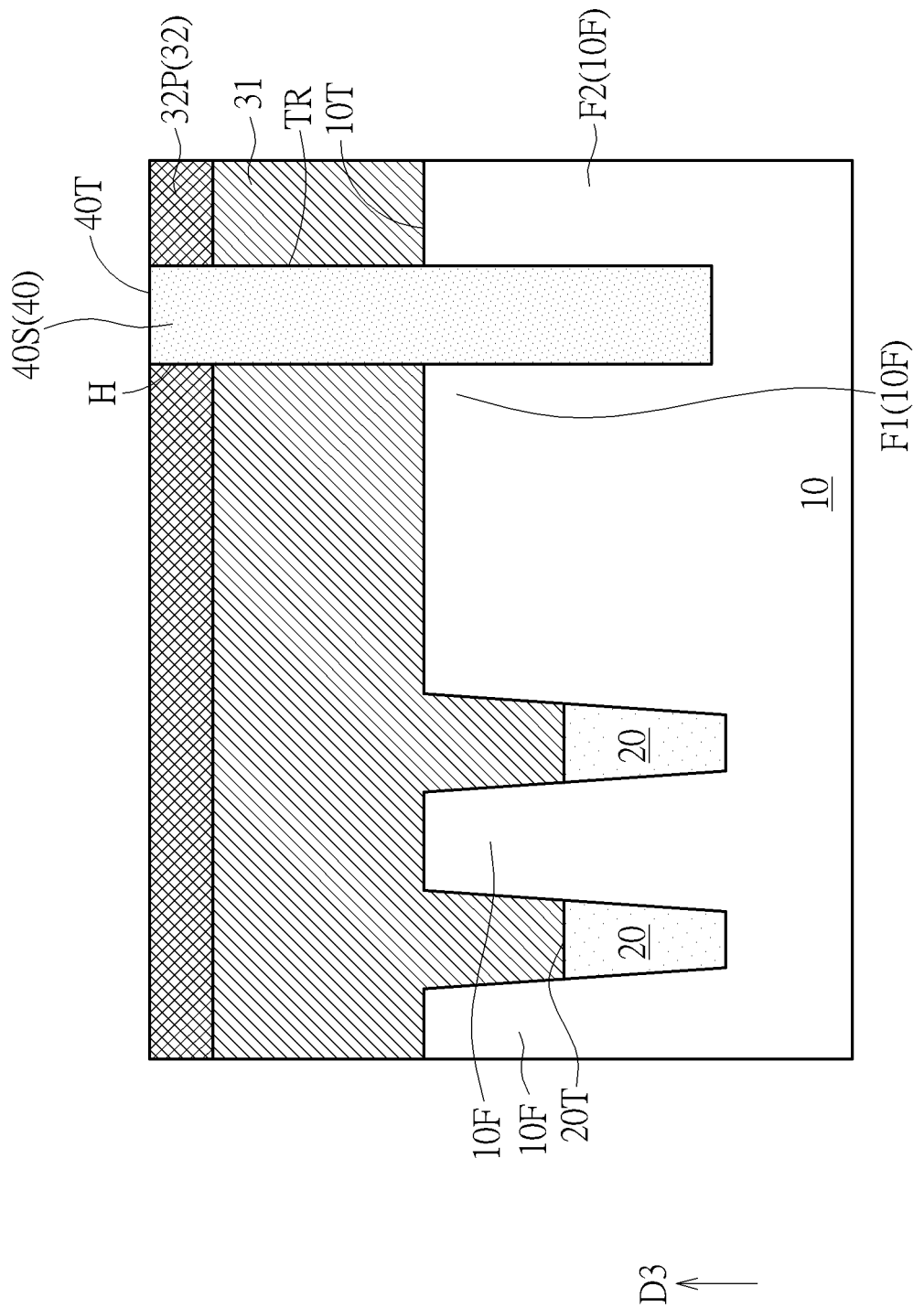
Figure 7:
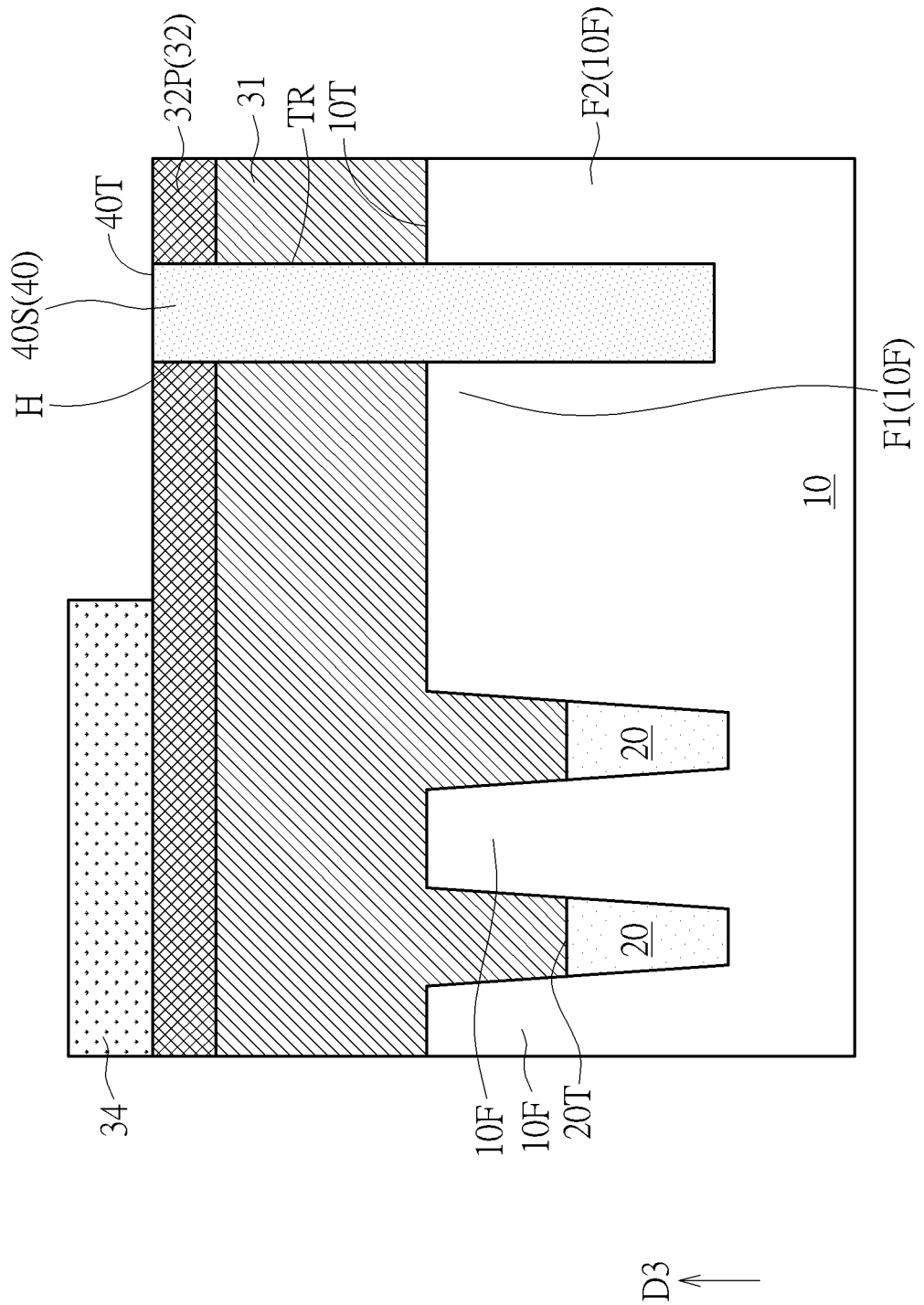
Figure 8:
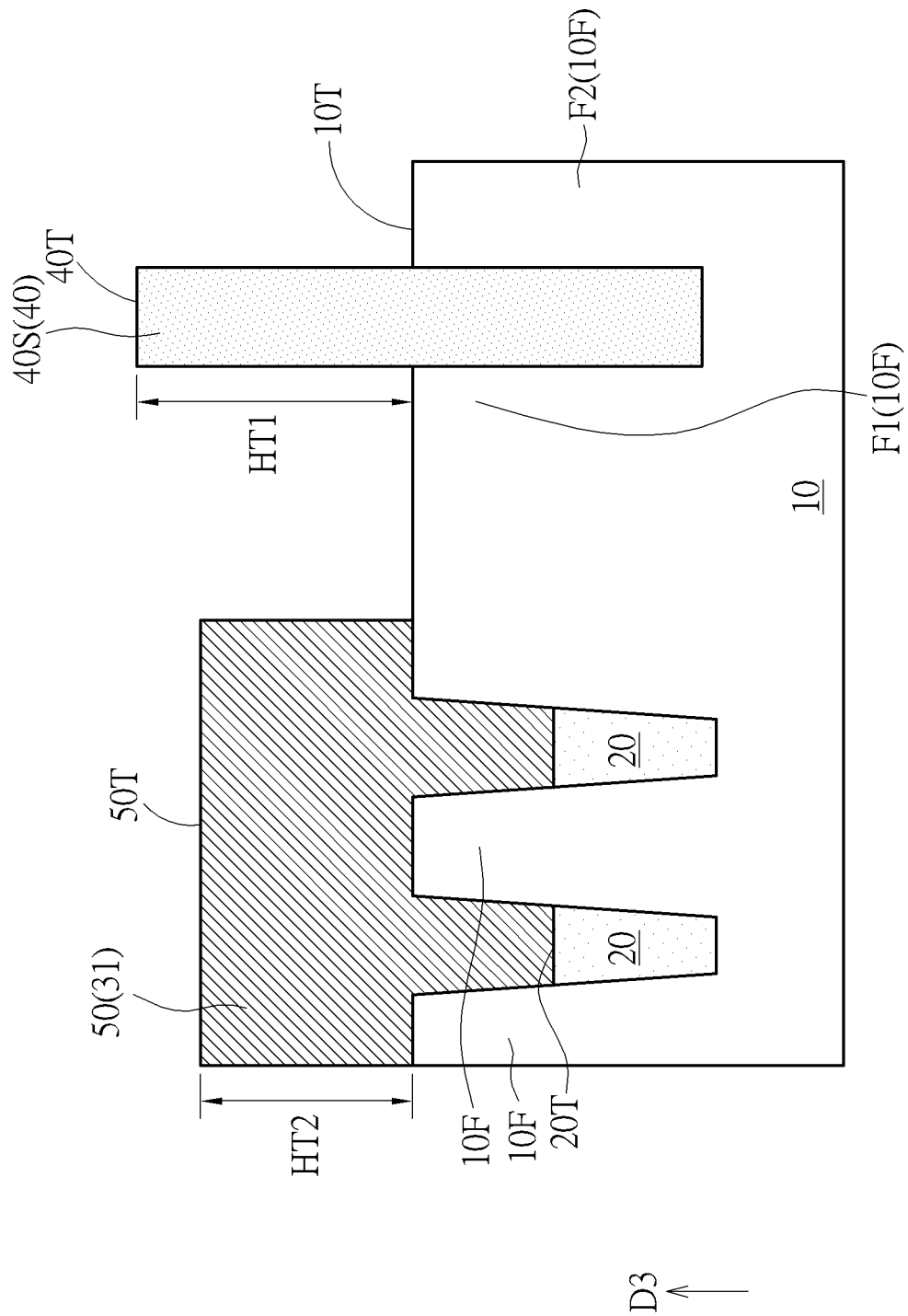
Figure 9:
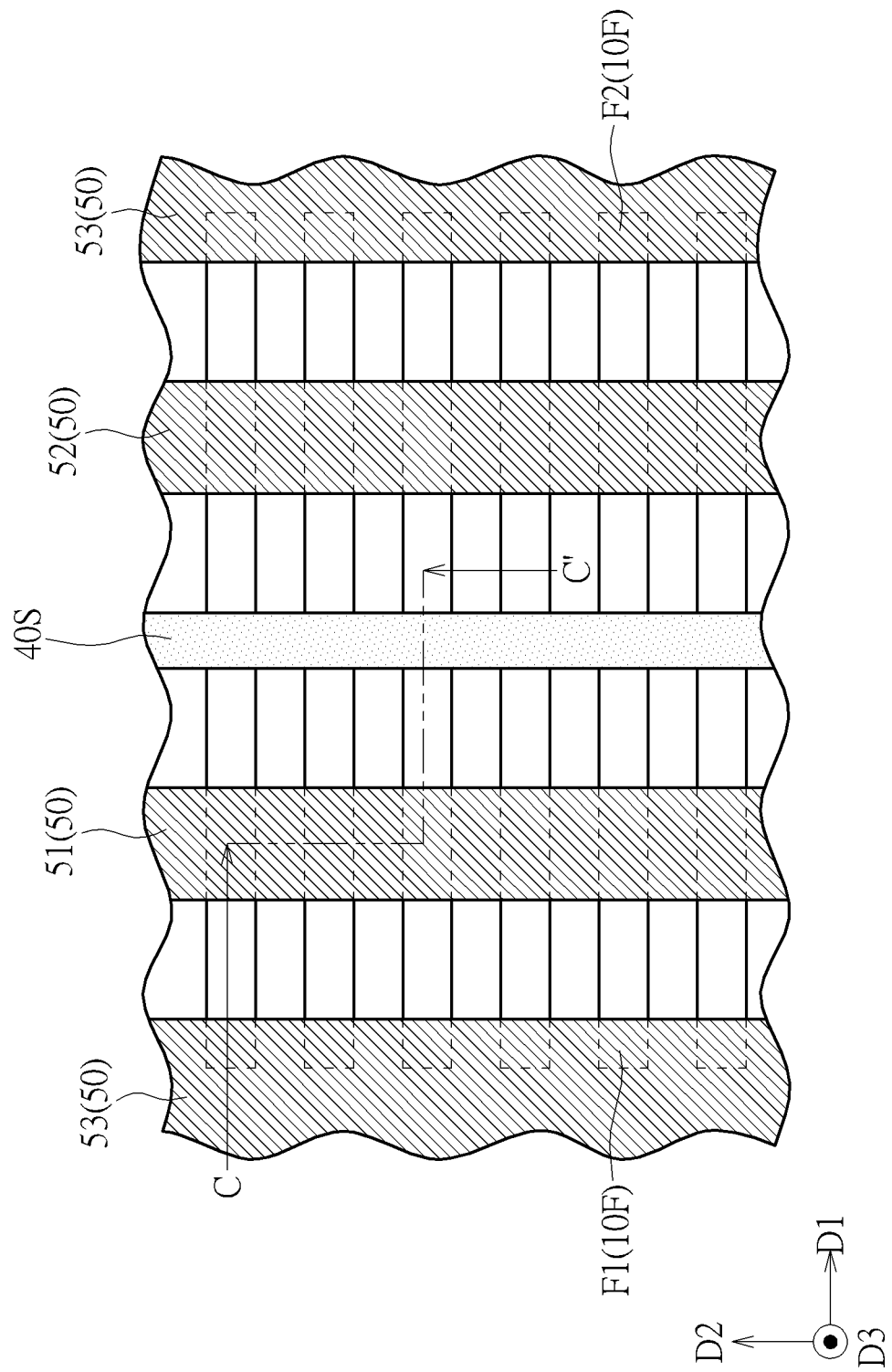
Figure 10:
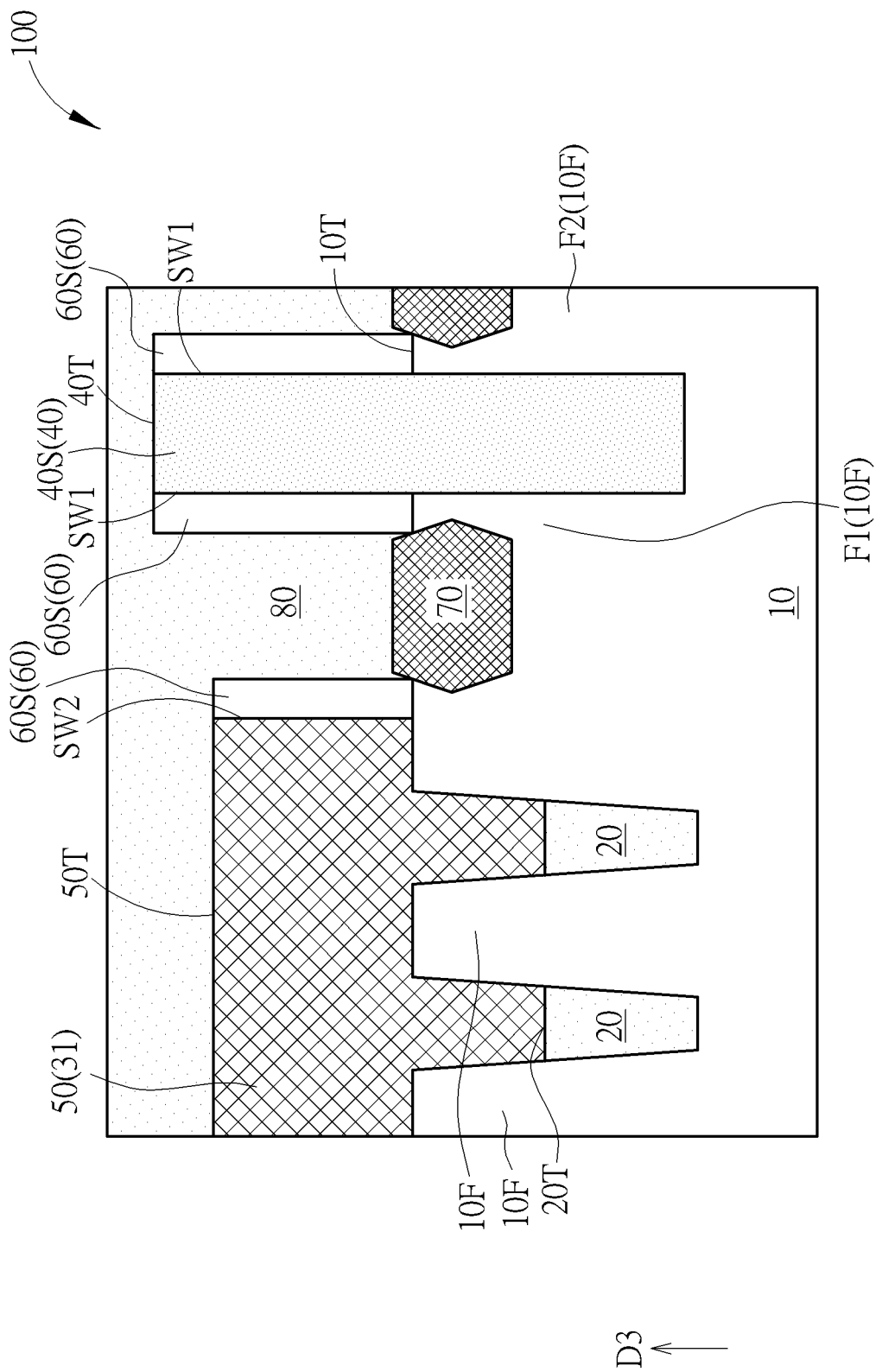

Please refer to FIGS. 1-11. FIGS. 1-11 are schematic drawings illustrating a manufacturing method of a semiconductor device according to a first embodiment of the present invention. FIG. 1, FIG. 3, FIG. 9, and FIG. 11 are top-view diagrams. FIG. 2 is a cross-sectional diagram taken along a line A-A' in FIG. 1, FIG. 4 is a cross-sectional diagram taken along a line B-B' in FIG. 3, FIG. 8 is a cross-sectional diagram taken along a line C-C' in FIG. 9, and FIG. 10 is a cross-sectional diagram taken along a line D-D' in FIG. 11. The manufacturing method of the semiconductor device in this embodiment includes the following steps. As shown in FIG. 1 and FIG. 2, a semiconductor substrate 10 is provided. The semiconductor substrate 10 in this embodiment may include a silicon substrate, an epitaxial silicon substrate, a silicon germanium substrate, a silicon carbide substrate, or a silicon-on-insulator (SOI) substrate, but not limited thereto. The semiconductor substrate 10 includes at least one fin structure 10F, and the fin structure 10F includes a fin-shaped structure made of semiconductor material. In this embodiment, the semiconductor substrate 10 may include a plurality of the fin structures 10F. Each of the fin structures 10F is elongated in a first direction D1, and the fin structures 10F are repeatedly disposed in a second direction D2. The first direction D1 may be substantially orthogonal to the second direction D2, but not limited thereto. The fin structures 10F may be formed by performing a patterning process, such as a multiple patterning process, to the semiconductor substrate 10. The fin structures 10F may be separated from one another by a shallow trench isolation (STI) structure 20. The shallow trench isolation structure 20 may be composed of a single layer or multiple layers of insulation materials, such as an oxide insulation material, but not limited thereto. A top surface 20T of the shallow trench isolation structure 20 is lower than a top surface 10T of the fin structure 10F in a vertical direction D3 for exposing a part of each of the fin structures 10F.

A gate material layer 31 is then formed on the semiconductor substrate 10, and the fin structures 10F are covered by the gate material layer 31. The gate material layer 31 is used to form gate structures (not shown in FIG. 1 and FIG. 2) in subsequent processes. The gate material layer 31 may include amorphous silicon or other suitable conductive materials, dielectric materials, or semiconductor materials.

As shown in FIGS. 1-6, a trench TR is then formed partly in the gate material layer 31 and partly in the fin structure 10F. An isolation structure 40S is then formed partly in the trench TR and partly outside the trench TR. Specifically, the method of forming the isolation structure 40S may include but is not limited to the following steps. As shown in FIG. 2, a mask layer 32 is formed on the gate material layer 31. The mask layer 32 may include dielectric materials, such as silicon nitride, or other suitable materials. As shown in FIGS. 2-4, the mask layer 32 is then patterned to be a patterned mask layer 32P. The patterned mask layer 32P may be formed by an etching process with another patterned mask layer (such as a first photoresist layer 33 shown in FIG. 4) formed on the mask layer 32 as a mask, but not limited thereto. In some embodiments of the present invention, the patterned mask layer 32P may also be formed by other suitable processes, such as a photo patterning process (when the mask layer 32 is a photo-patternable material), but not limited thereto.

Figure 5:
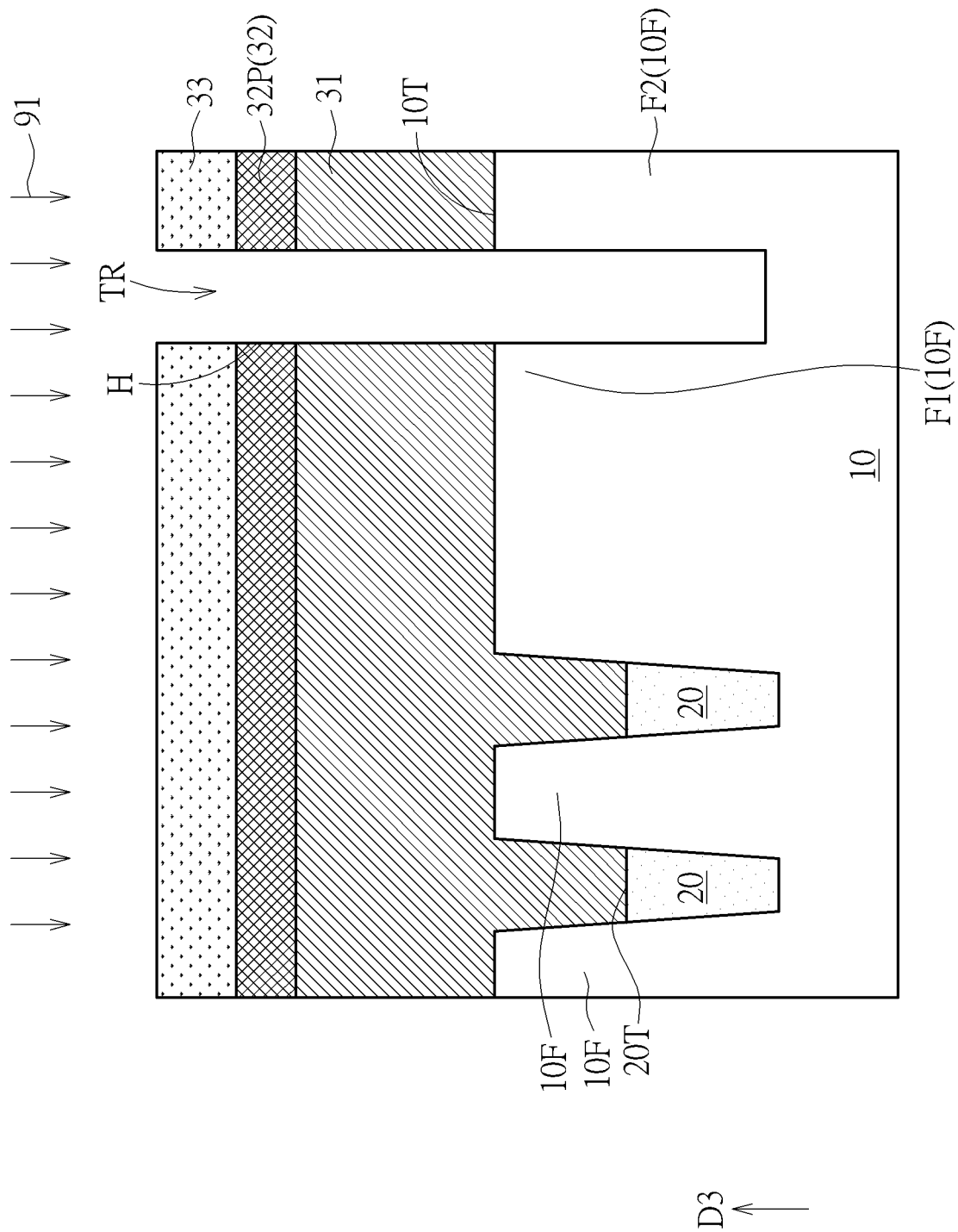

Accordingly, the patterned mask layer 32P is formed on the gate material layer 31, and the patterned mask layer 32P includes an opening H corresponding to a part of the fin structure 10F in the vertical direction D3. As shown in FIG. 5, an etching process 91 is then performed with the patterned mask layer 32P as a mask for removing a part of the gate material layer 31 and a part of the fin structure 10F for forming the trench TR. In this embodiment, the first photoresist layer 33 may remain on the patterned mask layer 32P in the etching process 91 for protecting the patterned mask layer 32P, but the present invention is not limited to this. In some embodiments of the present invention, the first photoresist layer may be removed before the etching process 91. In addition, the etching process 91 may include one etching step or more etching steps with different process conditions for etching the gate material layer 31 and the fin structure 10F respectively. The etching process 91 may include an anisotropic etching process, such as an anisotropic dry etching process, for forming the trench TR having a higher aspect ratio, but not limited thereto. The trench TR penetrates the gate material layer 31 in the vertical direction D3. The fin structure 10F is cut by the trench TR and divided into a first fin F1 and a second fin F2. The first fin F1 and the second fin F2 are elongated in the same direction, and a part of the trench TR is formed between the first fin F1 and the second fin F2 of the same fin structure 10F.

As shown in FIG. 5 and FIG. 6, the isolation structure 40S is formed in the trench TR and the opening H of the patterned mask layer 32P, and the first photoresist layer 33 may be removed before the step of forming the isolation structure 40S. The isolation structure 40S may be formed by filling the trench TR and the opening H of the patterned mask layer 32P with an isolation material 40. The isolation material 40 may include insulation materials, such as an oxide insulation material, or other suitable materials. Specifically, the isolation material 40 may be formed in the trench TR, in the opening H of the patterned mask layer 32P, and on the patterned mask layer 32P by a process such as a flowable chemical vapor deposition (FCVD) process, and the opening H and the trench TR are filled with the isolation material 40. A planarization process, such as a chemical mechanical polishing (CMP) process, may be performed to remove the isolation material 40 on the patterned mask layer 32P for forming the isolation structure 40S. Because the upper part of the isolation structure 40S is formed in the opening H of the patterned mask layer 32P, the upper part of the isolation structure 40S may be regarded as a part of the isolation structure 40S formed outside the trench TR. Therefore, a top surface 40T of the isolation structure 40S is higher than a top surface of the gate material layer 31 in the vertical direction D3, and a part of the isolation structure 40S formed outside the fin structure 10F may be formed self-aligned with a part of the isolation structure 40S formed in the fin structure 10F.

As shown in FIGS. 7-9, at least one gate structure 50 is formed straddling the fin structure 10F by patterning the gate material layer 31 after the step of forming the isolation structure 40S. Specifically, a second photoresist layer 34 may be formed on the patterned mask layer 32P, and the gate material layer 31 may then be patterned by a process such as an etching process with the second photoresist layer 34 as a mask, but not limited thereto. Other appropriate methods for patterning the gate material layer 31 are within the contemplated scope of the present invention. Additionally, the second photoresist layer 34 and the patterned mask layer 32P are removed after the step of forming the gate structure 50. As shown in FIG. 8 an FIG. 9, the top surface 40T of the isolation structure 40S is higher than a top surface 50T of the gate structure 50 in the vertical direction D3 because a part of the isolation structure 40S is formed in the opening of the patterned mask layer above the gate material layer 31. In other words, a distance between the top surface 40T of the isolation structure 40S and the top surface 10T of the fin structure 10F in the vertical direction D3 (such as a first height HT1 shown in FIG. 8) is longer than a distance between the top surface 50T of the gate structure 50 and the top surface 10T of the fin structure 10F in the vertical direction D3 (such as a second height HT2 shown in FIG. 8).

As shown in FIG. 8 and FIG. 9, in some embodiments of the present invention, a plurality of the gate structures 50 may be formed, and each of the gate structures may be elongated in the second direction D2 and be formed straddling the fin structures 10F. Each of the gate structures 50 may directly contact the top surface 10T and two side surfaces of the fin structure 10F, but not limited thereto. The gate structures 50 are separated from one another and disposed parallel with one another, and the isolation structure 40S may also be elongated in the second direction D2 and be parallel with the gate structures 50, but not limited thereto. For example, in some embodiments, the gate structures 50 may include a first gate structure 51, a second gate structure 52, and a third gate structure 53 disposed separated from one another and parallel with one another. The first gate structure 51 is formed straddling the first fin F1, and the second gate structure 52 is formed straddling the second fin F1. The isolation structure 40S is disposed between the first gate structure 51 and the second gate structure 52 in the first direction D1. The third gate structure 53 may be formed at an end of the first fin F1 while the isolation structure 40S is formed at another end of the first fin F1 in the first direction D1, or be formed at an end of the second fin F2 while the isolation structure 40S is formed at another end of the second fin F2 in the first direction D1. In some embodiments, the first gate structure 51 and the second gate structure 52 may be gate electrodes of different fin type semiconductor units respectively, and the first gate structure 51 and the second gate structure 52 may include conductive materials accordingly, but not limited thereto. In some embodiments, the first gate structure 51, the second gate structure 52, and the third gate structure 53 may be dummy gate structures for a replacement metal gate (RMG) process performed subsequently, and the materials of the first gate structure 51, the second gate structure 52, and the third gate structure 53 may include semiconductor materials such as amorphous silicon or polysilicon, but not limited thereto. Additionally, the gate structure 50 may include a gate dielectric layer (not shown) formed on the fin structure 10F and the structure 20, but not limited thereto.

Figure 11:
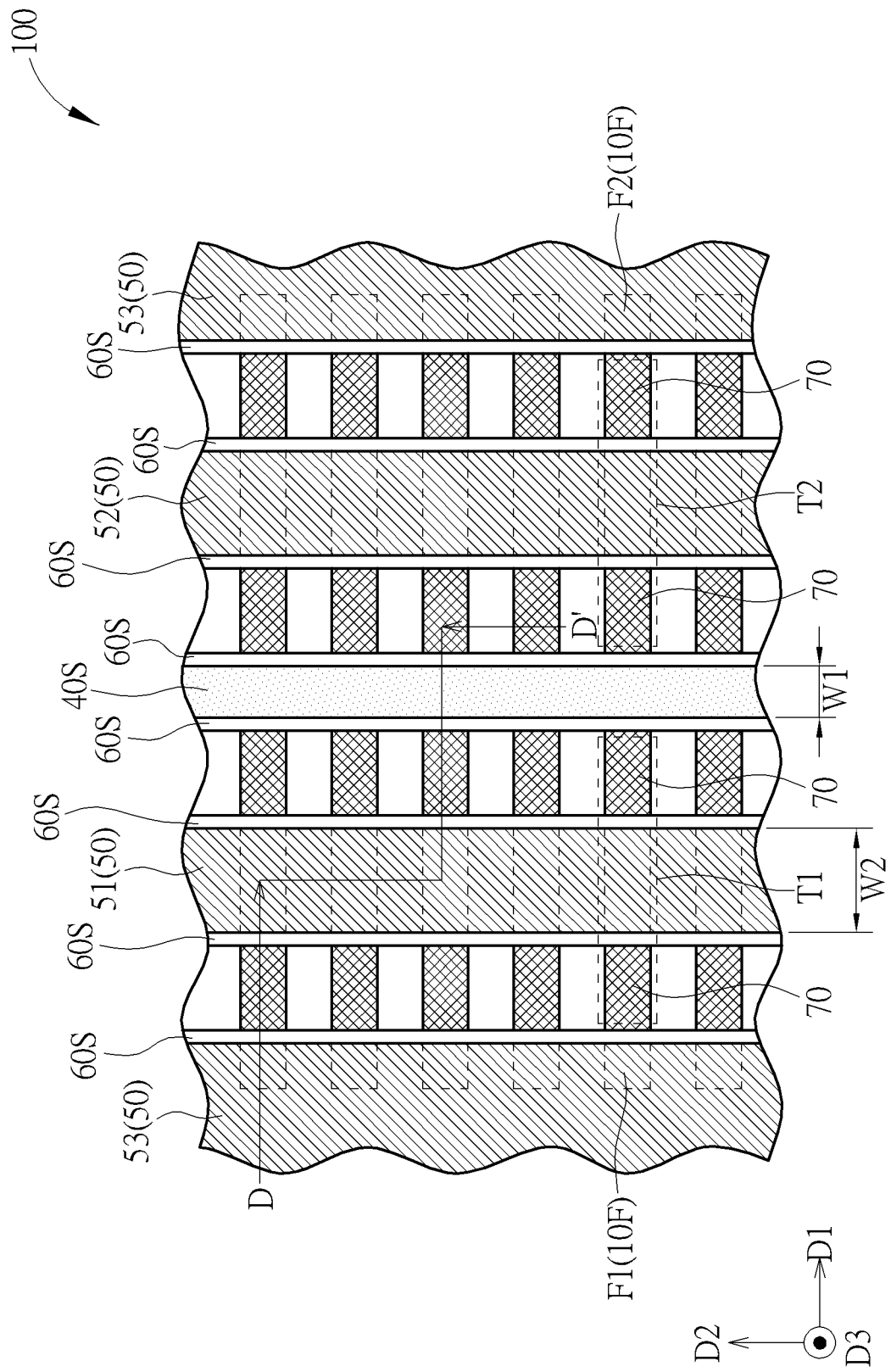

As shown in FIG. 10 and FIG. 11, a sidewall spacer 60S may be formed on sidewalls SW1 of the isolation structure 40S above the top surface 10T of the fin structure 10F. The sidewall spacer 60S may be further formed on sidewalls SW2 of the gate structure 50. The method of forming the sidewall spacer 60S may include but is not limited to the following steps. For example, a spacer material layer 60 may be formed conformally on the surfaces of the gate structure 50, the isolation structure 40S, and the fin structure 10F first, and an anisotropic etching process may then be performed to remove a part of the spacer material layer 60 for forming the sidewall spacer 60S on the sidewalls SW1 of the isolation structure 40S and the sidewalls SW2 of the gate structures 50. The spacer material layer 60 may include oxide, nitride, oxynitride, or other suitable insulation materials, and the sidewall spacer 60S may be composed of a single spacer material layer or multiple spacer material layers. Accordingly, the sidewall spacer 60S is formed after the step of forming the isolation structure 40S and the step of forming the gate structures 50, and the sidewall spacer 60S formed on the sidewalls SW1 of the isolation structure 40S is higher than the sidewall spacer 60S formed on the sidewalls SW2 of the gate structure 50 because the top surface 40T of the isolation structure 40S is higher than the top surface 50T of the gate structure 50 in the vertical direction D3.

Subsequently, a plurality of source/drain regions 70 may be formed in the fin structures 10F, and each of the source/drain regions 70 is at least partially formed in the corresponding fin structure 10F. For example, each of the source/drain regions 70 may include an epitaxial structure extending upwards and beyond the top surface 10T of the fin structure 10F, but not limited thereto. A part of the source/drain regions 70 may be formed at two opposite sides of the first gate structure 51 in the first direction D1, and the other part of the source/drain regions 70 may be formed at two opposite sides of the second gate structure 52 in the first direction D1. Therefore, some of the source/drain regions 70 may be formed in the fin structure 10F between the isolation structure 40S and one of the gate structures 50, and each of these source/drain regions 70 may directly contact the sidewall spacer 60S formed on the isolation structure 40S and the sidewall spacer 60S formed on the corresponding gate structure 50, but not limited thereto.

After the step of forming the source/drain regions 70, an interlayer dielectric 80 may be formed to cover the isolation structure 40S, the source/drain regions 70, and the gate structures 50. The interlayer dielectric 80 may include oxide, nitride, oxynitride, or other suitable dielectric materials. After the manufacturing method described above, a semiconductor device 100 shown in FIG. 10 and FIG. 11 may be formed. The semiconductor device 100 includes the semiconductor substrate 10, a plurality of the gate structures 50, the interlayer dielectric 80, and the isolation structure 40S. The semiconductor substrate 10 includes at least one fin structure 10F. The gate structures 50 are disposed straddling the fin structure 10F. The interlayer dielectric 80 is disposed on the fin structure 10F. The isolation structure 40S is partly disposed in the fin structure 10F and partly disposed in the interlayer dielectric 80 above the fin structure 10F. The top surface 40T of the isolation structure 40S is higher than the top surface 50T of each of the gate structures 50 in the vertical direction D3.

The semiconductor device 100 further includes the sidewall spacer 60S and the source/drain regions 70. The sidewall spacer 60S is disposed on the sidewalls SW1 of the isolation structure 40S and the sidewalls SW2 of the gate structures 50. The sidewall spacer 60S disposed on the sidewalls SW1 of the isolation structure 40S is higher than the sidewall spacer 60S disposed on the sidewalls SW2 of the gate structures 50 in the vertical direction D3. Each of the source/drain regions 70 is at least partially disposed in the fin structure 10F. The source/drain regions 70 are disposed on two sides of each of the gate structures 50 in the extending direction of the fin structure 10F (such as the first direction D1 shown in FIG. 11), and some of the source/drain regions 70 are disposed between the isolation structure 40S and the gate structures 50. The gate structures 50 in the semiconductor device 100 are separated from one another and disposed parallel with one another. The isolation structure 40S may be elongated in the second direction D2 and parallel with the gate structures 50, but not limited thereto. In some embodiments, the gate structures 50 may include the first gate structure 51, the second gate structure 52, and the third gate structures 53. The first gate structure 51 is disposed straddling the first fin F1, and the second gate structure 52 is disposed straddling the second fin F1. The isolation structure 40S is disposed between the first gate structure 51 and the second gate structure 52 in the first direction D1.

In some embodiments, the first gate structure 51, the first fin F1, and the source/drain regions disposed in the first fin F1 at two sides of the first gate structure 51 may form a first semiconductor unit T1. The second gate structure 52, the second fin F2, and the source/drain regions disposed in the second fin F2 at two sides of the second gate structure 52 may form a second semiconductor unit T2. The first semiconductor unit T1 and the second semiconductor unit T2 may be fin type semiconductor units, such as fin field effect transistors, but not limited thereto. The isolation structure 40S is disposed between the first semiconductor unit T1 and the second semiconductor unit T2 for electrically separating the first fin F1 of the first semiconductor unit T1 from the second fin F2 of the second semiconductor unit T2. In other words, the isolation structure 40S may be regarded as a diffusion break partly formed in the fin structure 10F and formed between the first fin F1 and the second F2 of the fin structure 10F. Because the top surface 40T of the isolation structure 40S is higher than the top surface 50T of the gate structure 50 and the sidewall spacer 60S, which is used in the process of forming the source/drain regions 70, is formed on the sidewalls SW1 of the isolation structure 40S, there is no need to formed a gate structure on the isolation structure 40S, and negative influence of the gate structure formed on the isolation structure 40S on the isolation performance of the isolation structure 40S may be avoided accordingly. For example, when the isolation structure 40 does not protrude and being formed partly above the fin structure 10F, a gate structure has to be formed on the isolation structure 40 for forming a sidewall spacer on the sidewall of the gate structure on the isolation structure 40. However, problems, such as leakage current between the first fin F1 and the second fin F2, may be generated by the gate structure formed on the isolation structure 40S especially when the gate structure partially sink into the isolation structure 40S, and the isolation performance of the isolation structure 40S will be affected accordingly. Therefore, there is no need to formed a gate structure on the isolation structure 40S in the semiconductor device of the present invention because the isolation structure 40 is partly formed in the fin structure 10F and partly formed in the interlayer dielectric 80 above the fin structure 10F, and the isolation structure 40 is higher than the gate structures 50 for further enhancing the isolation performance of the isolation structure 40S.

In some embodiments, the first gate structure 51, the second gate structure 52, and the third gate structures 53 may be dummy gate structures for a replacement metal gate process performed subsequently. In some embodiments, the first gate structure 51 and the second gate structure 52 may be the gate electrode of the first semiconductor unit T1 and the gate electrode of the second semiconductor unit T2 respectively, and the semiconductor device 100 may include a plurality of fin type semiconductor units, but not limited thereto. It is worth noting that, in some embodiments, a width W1 of the isolation structure 40S may be smaller than a width W2 of each of the gate structures 50 in the extending direction of the fin structure 50 (such as the first direction D1 shown in FIG. 11) for further reducing the distance between the first semiconductor unit T1 and the second semiconductor unit T2, and the integrity of the semiconductor device 100 may be enhanced accordingly.

The following description will detail the different embodiments of the present invention. To simplify the description, identical components in each of the following embodiments are marked with identical symbols. For making it easier to understand the differences between the embodiments, the following description will detail the dissimilarities among different embodiments and the identical features will not be redundantly described.

Figure 12:
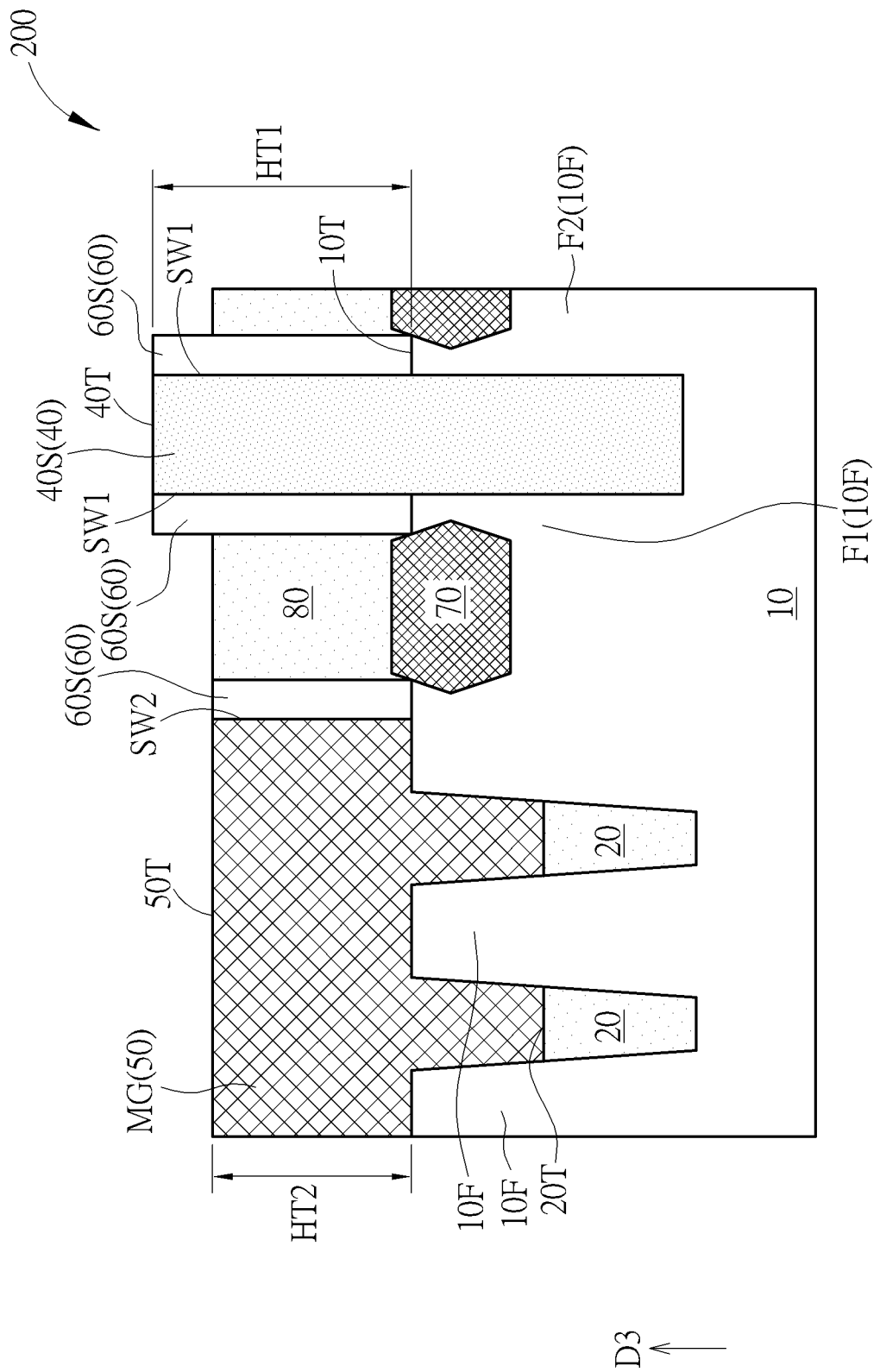
FIG. 12 is a schematic drawing illustrating a semiconductor device according to a second embodiment of the present invention.

Please refer to FIG. 12. FIG. 12 is a schematic drawing illustrating a semiconductor device according to a second embodiment of the present invention. As shown in FIG. 12, the difference between the semiconductor device 200 in this embodiment and the semiconductor device in the first embodiment mentioned above is that the gate material layer in the gate structure 50 is removed by the replacement metal gate process for forming a metal gate structure MG. In other words, the gate structure 50 in this embodiment may include the metal gate structure MG, and the top surface 40T of the isolation structure 40S is higher than the top surface 50T of the metal gate structure MG. The distance between the top surface 40T of the isolation structure 40S and the top surface 10T of the fin structure 10F in the vertical direction D3 (such as the first height HT1 shown in FIG. 12) is longer than the distance between the top surface 50T of the metal gate structure MG and the top surface 10T of the fin structure 10F in the vertical direction D3 (such as the second height HT2 shown in FIG. 12). It is worth noting that a chemical mechanical polishing process may be performed in the replacement metal gate process, and the top surface 40T of the isolation structure 40S is still higher than the top surface 50T of the gate structure 50 because the material of the isolation structure 40S is harder than the interlayer dielectric 80 by thermal processes performed before the step of forming the interlayer dielectric 80 and after the step of forming the isolation structure 40S.

Figure 13:
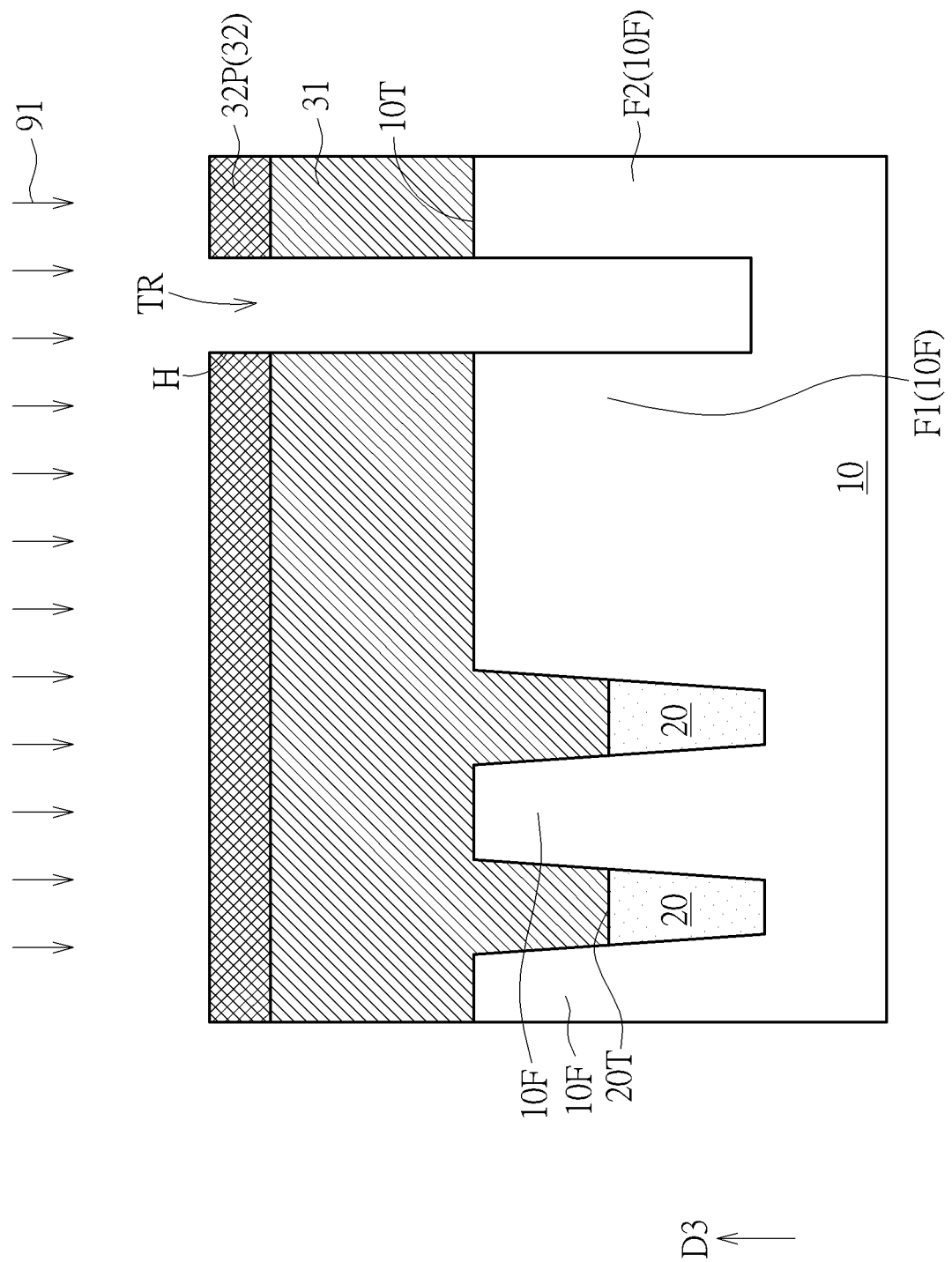
FIG. 13 is a schematic drawing illustrating a manufacturing method of a semiconductor device according to a third embodiment of the present invention.

Please refer to FIG. 13. FIG. 13 is a schematic drawing illustrating a manufacturing method of a semiconductor device according to a third embodiment of the present invention. As shown in FIG. 13, the difference between the manufacturing method in this embodiment and the manufacturing method in the first embodiment mentioned above is that, in the manufacturing method of this embodiment, the first photoresist layer described in the first embodiment may be removed before the etching process 91 of forming the trench TR. The thickness of the patterned mask layer 32P should be controlled for ensuring that the isolation structure subsequently formed in the trench TR and the opening H of the patterned mask layer 32P will be higher than the gate structure formed by patterning the gate material layer 31 under the patterned mask layer 32P.

Figure 14:
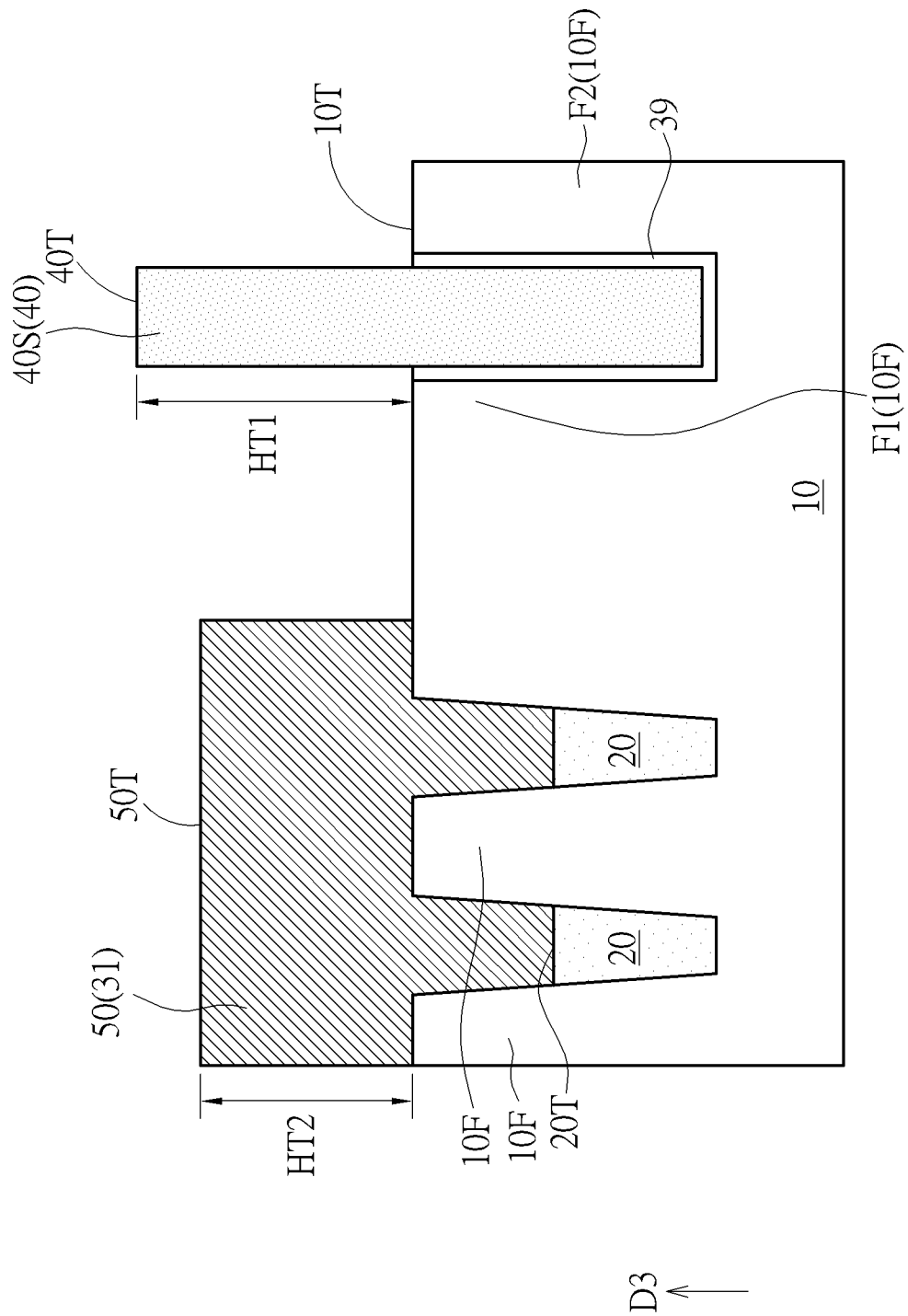
FIG. 14 and FIG. 15 are schematic drawings illustrating a manufacturing method of a semiconductor device according to a fourth embodiment of the present invention.
Figure 15:
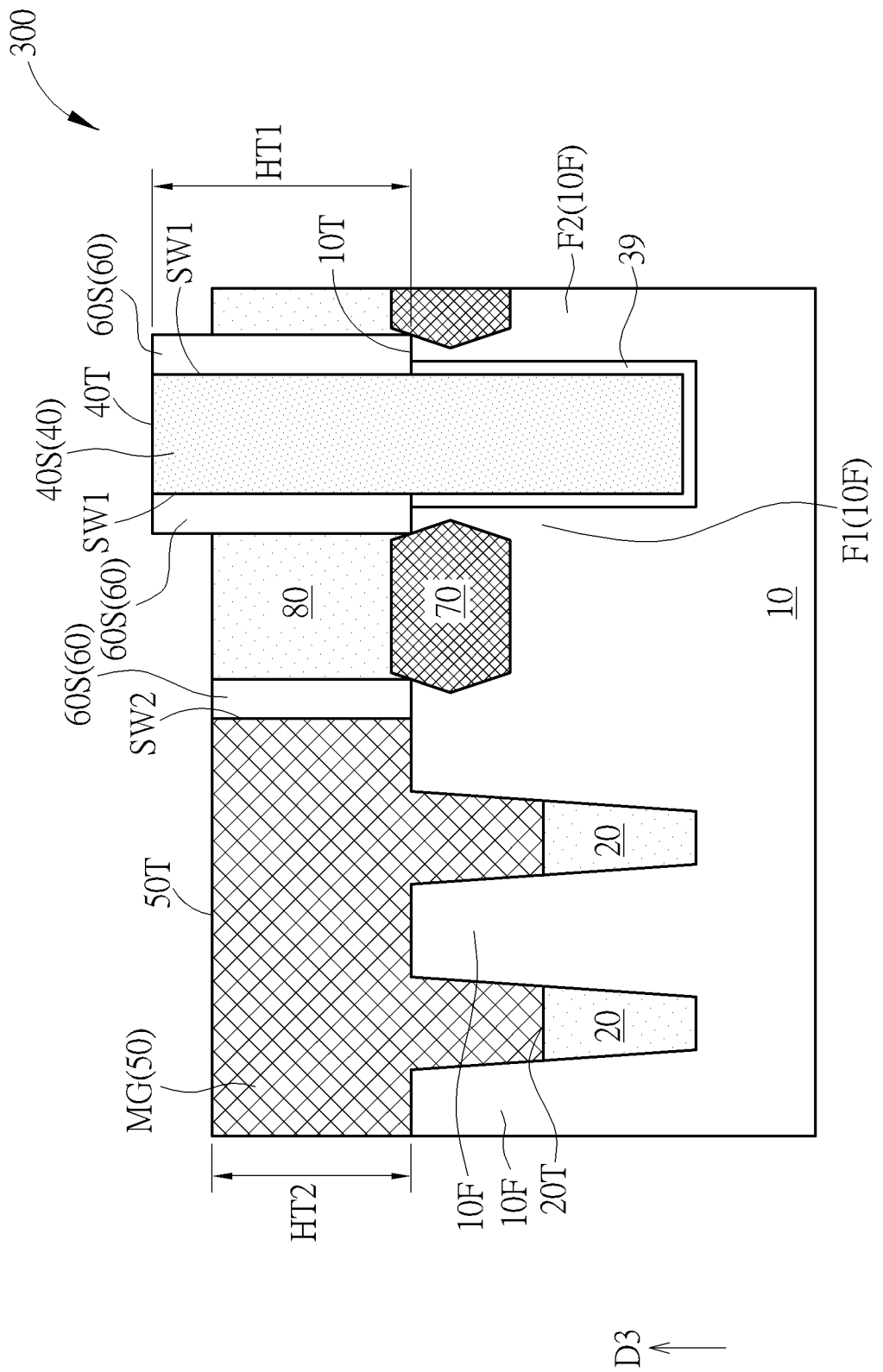

Please refer to FIG. 14 and FIG. 15. FIG. 14 and FIG. 15 are schematic drawings illustrating a manufacturing method of a semiconductor device 300 according to a fourth embodiment of the present invention. As shown in FIG. 14 and FIG. 15, the difference between the manufacturing method in this embodiment and the manufacturing method in the first embodiment mentioned above is that, a liner 39 may be formed surrounding the isolation structure 40S in the fin structure 10F. The liner 39 may include dielectric materials such as silicon oxide, silicon nitride, or silicon oxynitride, but not limited thereto. The liner 39 may be formed in the trench before the step of forming the isolation material 40 by processes such as a thermal treatment or/and a deposition process. A part of the liner 39 formed isolation structure 40S outside the fin structure 10F may be removed in the step of forming the gate structure 50. Therefore, the semiconductor device 300 in this embodiment may further include the liner 39 surrounding the isolation structure 40S in the fin structure 10F, and the isolation structure 40S outside the fin structure 10F may directly contact the sidewall spacer 60S.

To summarize the above descriptions, in the semiconductor device and the manufacturing method thereof according to the present invention, the isolation structure is partly formed in the fin structure and partly formed in the interlayer dielectric above the fin structure for provide the isolation effect between the first fin and the second fin of the same fin structure. The sidewall spacer is formed on the sidewalls of the isolation structure, and there is no need to form a gate structure on the isolation structure accordingly. The negative influence of the gate structure formed on the isolation structure or sinking into the isolation structure may be avoided. Additionally, the trench is formed in the fin structure and penetrates the gate material layer, the isolation structure is formed partly in the trench and partly outside the trench for being higher than the gate material layer and the gate structure formed by patterning the gate material layer. The isolation performance of the isolation structure may be further enhanced accordingly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
   a semiconductor substrate, wherein the semiconductor substrate comprises at least one fin structure;
   a plurality of gate structures disposed straddling the at least one fin structure;
   an interlayer dielectric disposed on the at least one fin structure;
   an isolation structure partly disposed in the at least one fin structure and partly disposed in the interlayer dielectric above the at least one fin structure, wherein a topmost surface of the isolation structure is higher than a topmost surface of each of the gate structures in a vertical direction; and
   a plurality of source/drain regions at least partially disposed in the at least one fin structure, wherein the source/drain regions are disposed on two sides of each of the gate structures in an extending direction of the at least one fin structure, and some of the source/drain regions are disposed between the isolation structure and the gate structures.

2. The semiconductor device of claim 1, wherein a distance between the topmost surface of the isolation structure and a top surface of the at least one fin structure in the vertical direction is longer than a distance between the topmost surface of each of the gate structures and the top surface of the at least one fin structure in the vertical direction.

3. The semiconductor device of claim 1, further comprising:
   a sidewall spacer disposed on sidewalls of the isolation structure and sidewalls of the gate structures, wherein the sidewall spacer disposed on the sidewalls of the isolation structure is higher than the sidewall spacer disposed on the sidewalls of the gate structures in the vertical direction.

4. The semiconductor device of claim 1, wherein a maximum width of the isolation structure is smaller than a maximum width of each of the gate structures in an extending direction of the at least one fin structure.

5. The semiconductor device of claim 1, wherein the gate structures comprises metal gate structures or dummy gate structures.

6. The semiconductor device of claim 1, wherein the interlayer dielectric is partly disposed on the topmost surface of the isolation structure and partly disposed on the topmost surface of each of the gate structures.

\* \* \* \* \*